US009552866B2

(12) United States Patent
Mochida

(10) Patent No.: US 9,552,866 B2
(45) Date of Patent: Jan. 24, 2017

(54) SEMICONDUCTOR DEVICE INCLUDING SUBWORD DRIVER CIRCUIT

(71) Applicant: Micron Technology, Inc., Boise, ID (US)

(72) Inventor: Noriaki Mochida, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/642,411

(22) Filed: Mar. 9, 2015

(65) Prior Publication Data
US 2015/0255146 A1   Sep. 10, 2015

(30) Foreign Application Priority Data

Mar. 10, 2014 (JP) ................................ 2014-046021

(51) Int. Cl.
| G11C 5/06 | (2006.01) |
| G11C 5/14 | (2006.01) |
| G11C 8/00 | (2006.01) |
| G11C 11/408 | (2006.01) |
| G11C 11/4097 | (2006.01) |
| G11C 8/08 | (2006.01) |

(52) U.S. Cl.
CPC ............. *G11C 11/4085* (2013.01); *G11C 8/08* (2013.01); *G11C 11/4097* (2013.01)

(58) Field of Classification Search
USPC ........................ 365/63, 226, 230.03, 230.06
See application file for complete search history.

(56) References Cited

U.S. PATENT DOCUMENTS

| 6,249,477 | B1* | 6/2001 | Ohtsuki | ................... G11C 8/08 365/230.06 |
| 6,407,942 | B2* | 6/2002 | Aritomi | ................... G11C 8/10 365/63 |
| 8,699,295 | B2* | 4/2014 | Lee | ........................... G11C 8/08 365/230.06 |
| 9,111,633 | B2* | 8/2015 | Kim | .................... G11C 11/4085 |

FOREIGN PATENT DOCUMENTS

JP    2013-157044    8/2013

OTHER PUBLICATIONS

Kwon et al. Patent Application Publication US 2014/0241076.*

* cited by examiner

*Primary Examiner* — Trong Phan
(74) *Attorney, Agent, or Firm* — Dorsey & Whitney LLP

(57) ABSTRACT

The present invention is provided with: subword drivers SWD for driving subword lines SWL, a selection circuit for supplying either negative potential VKK1 or VKK2 to the subword drivers SWD, and memory cells MC that are selected in the case when the subword line SWL is set to an active potential VPP and are not selected in the case when the subword line SWL is either a negative potential VKK1 or VKK2.

15 Claims, 26 Drawing Sheets

SEMICONDUCTOR DEVICE INCLUDING SUBWORD DRIVER CIRCUIT

This application is based upon and claims the benefit of priority from Japanese Patent Application No. 2014-046021 filed on Mar. 10, 2014, the disclosure of which is incorporated herein in its entirely by reference.

BACKGROUND

Field of Invention

The present invention relates to a semiconductor device, in particular, to such a semiconductor device having subword drivers for driving subword lines.

Description of the Related Art

In a memory-type semiconductor device such as a DRAM (Dynamic Random Access Memory), memory cells are disposed on intersections between the subword lines and bit lines. The driving process of the subword lines is carried out by subword drivers, and when the subword line is driven to an active potential, the memory cell is connected to the corresponding bit line. On the other hand, during a period in which the subword line is driven to a non-active potential, the memory cell and the bit line are kept in a cut-off state.

The non-active potential of the subword line in the DRAM is normally set to a negative potential lower than the ground potential (see JP-A No. 2013-157044). This is because by setting the subword line to the negative potential, the off-leak current of cell transistors included in the memory cell is reduced, thereby making it to possible to prevent an information retaining characteristic from being deteriorated due to a disturbance phenomenon. The disturbance phenomenon refers to a phenomenon in which, when a certain subword line is repeatedly accessed, the information retaining characteristic of a memory cell connected to another subword line adjacent thereto is lowered.

In this case, however, when the negative potential to be given to the subword line is too low, a GIDL (Gate-Introduced Drain Leakage) current increases due to a voltage between the gate and drain.

SUMMARY

Disclosure of the above-identified Patent Literature is incorporated herein by reference. The above analysis has been made by the inventors of the present invention.

According to a first aspect of the present invention, there is provided semiconductor device including:
a plurality of subword lines;
a plurality of bit lines;
a plurality of memory cells, each arranged at intersection positions of the plurality of subword lines and the plurality of the bit lines; and
a plurality of subword driver circuits, each coupled to associated one of the subword lines and configured to supply one of a first non selection potential, a second non selection potential different from the first non selection potential and a third selection potential different from the first and second non selection potentials.

According to a second aspect of the present invention, there is provided a semiconductor device including:
a first subword line coupled to a memory cell; and
a first subword driver circuit coupled to the first subword line, the first subword driver circuit configured to supply at least one of a first negative potential and a second negative potential different from the first negative potential to the first subword line,
wherein each of the first and second negative potentials is a negative potential.

According to a third aspect of the present invention, there is provided a semiconductor device including:
a first subword line;
a first memory cell coupled to the first subword line;
a first subword driver circuit coupled to the first subword line to drive the first subword line; and
a first selection circuit coupled to the first subword driver circuit and configured to supply at least one of a first potential, a second potential different from the first potential, a third potential different from the first and second potentials and a fourth potential different from the first, second and third potentials.

In some embodiments of the present invention, the non-active potential can be switched depending on the accessing state. With this configuration, it becomes possible to reduce the GIDL current, while improving the disturbance characteristic of the memory.

EMBODIMENTS

Referring to attached drawings, the following description will explain preferred embodiments of the present invention.

Figure 1:
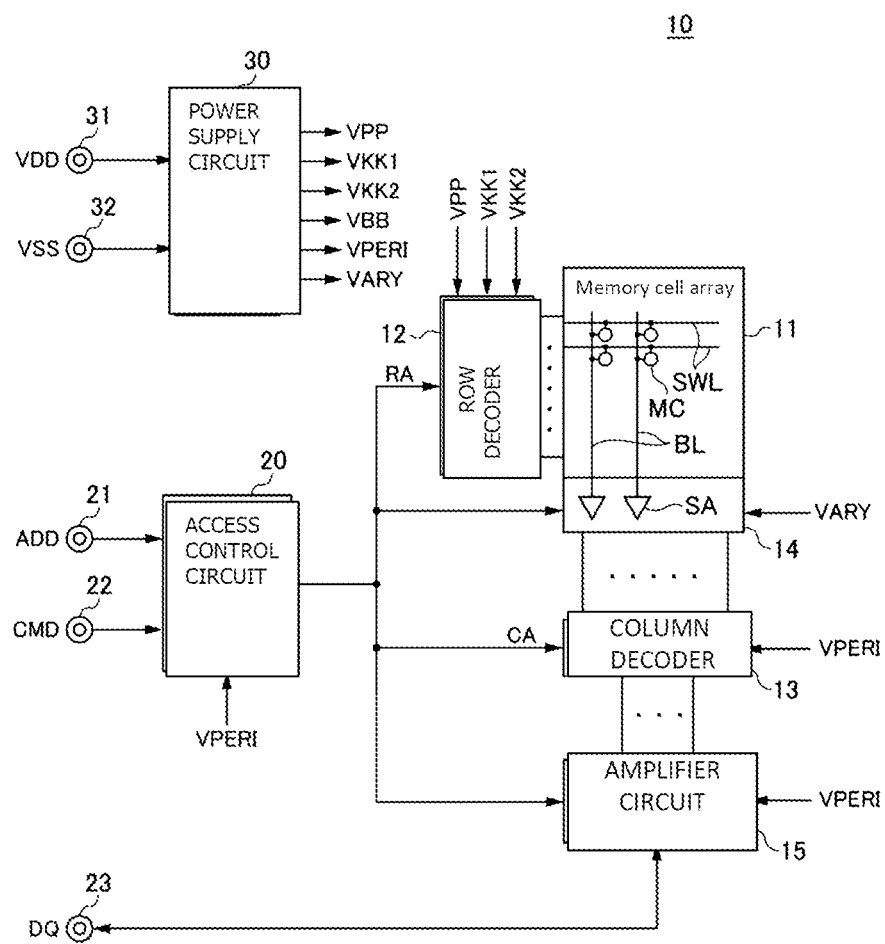
FIG. 1 is a block diagram showing the overall configuration of a semiconductor device 10 in accordance with a preferred embodiment of the present invention.

FIG. 1 is a block diagram showing an overall configuration of a semiconductor device 10 in accordance with a preferred embodiment of the present invention.

The semiconductor device 10 of the present embodiment is a DRAM, which is provided with a memory cell array 11, as shown in FIG. 1. The memory cell array 11 includes a plurality of subword lines SWL and a plurality of bit lines BL that intersect with each other, with memory cells disposed at the intersections. The selection of the subword line SWL is carried out by a row decoder 12, and the selection of the bit line is carried out by a column decoder 13. Each of the bit lines BL is connected to a corresponding sense amplifier SA inside a sense circuit 14, and the bit line BL selected by the column decoder 13 is connected to an amplifier circuit 15 through the sense amplifier SA.

The operations of the row decoder 12, the column decoder 13, the sense circuit 14 and the amplifier circuit 15 are controlled by an access control circuit 20. An address signal ADD and a command signal CMD are externally supplied respectively through an address terminal 21 and a command terminal 22 to the access control circuit 20. The access control circuit 20 receives the address signal ADD and the command signal CMD, and based upon these, controls the operations of the row decoder 12, the column decoder 13, the sense circuit 14 and the amplifier circuit 15.

More specifically, in the case when the command signal CMD indicates an active command, the address signal ADD (row address RA) is supplied to the row decoder 12. In response to this, the row decoder 12 selects a subword line SWL indicated by the row address RA so that the associated memory cell MC is subsequently connected to the bit line BL. Thereafter, the access control circuit 20 activates the sense circuit 14 at a predetermined timing.

On the other hand, in the case when the command signal CMD indicates a read command or a write command, the address signal ADD (column address CA) is supplied to the column decoder 13. In response to this, the column decoder 13 connects the bit line BL indicated by the column address CA to the amplifier circuit 15. With this arrangement, at the time of a reading operation, read data DQ read from the memory array 11 are externally outputted from a data terminal 23 through the amplifier 15. Moreover, at the time of a writing operation, read data DQ externally supplied through the data terminal 23 are written in the memory cell MC through the amplifier circuit 15 and the sense amplifier SA.

These circuit blocks respectively use predetermined internal voltages as operation power supplies. These internal power supplies are generated by a power supply circuit 30 shown in FIG. 1. The power supply circuit 30 receives an external potential VDD and a ground potential VSS respectively supplied thereto through power supply terminals 31 and 32, and based upon these, generates internal potentials VPP, VKK1, VKK2, VBB, VPERI, VARY, and the like. In the present embodiment, $VPP>VDD>VPERI \approx VARY>VSS>VKK1>VKK2>VBB$ are satisfied. That is, any of the internal potentials VKK1, VKK2, and VBB are negative potentials. In the following description, the internal potentials VKK1, VKK2 and VBB are respectively referred to as "first negative potential", "second negative potential" and "substrate potential" in some cases.

The internal potentials VPP, VKK1 and VKK2 are potentials to be mainly used in the row decoder 12. Although the detailed description thereof will be given later, the row decoder 12 drives the subword line SWL selected based upon the address signal ADD to a VPP level corresponding to a high potential so that the cell transistor contained in the memory cell MC is turned on. On the other hand, either one of the negative potentials VKK1 and VKK2 is supplied to the non selected subword line.

The internal potential VARY is a potential to be used in the sense circuit 14. When the sense circuit 14 is activated, the read data read out is amplified by driving one of the paired bit lines to a VARY level with the other one being driven to a VSS level. The internal potential VPERI is used as a power supply potential for most of the peripheral circuits, such as the access control circuit 20 or the like. By using the internal potential VPERI having a lower potential than the external potential VDD as the power supply potential of these peripheral circuits, it may be possible to reduce power consumption of the semiconductor device 10.

Figure 2:
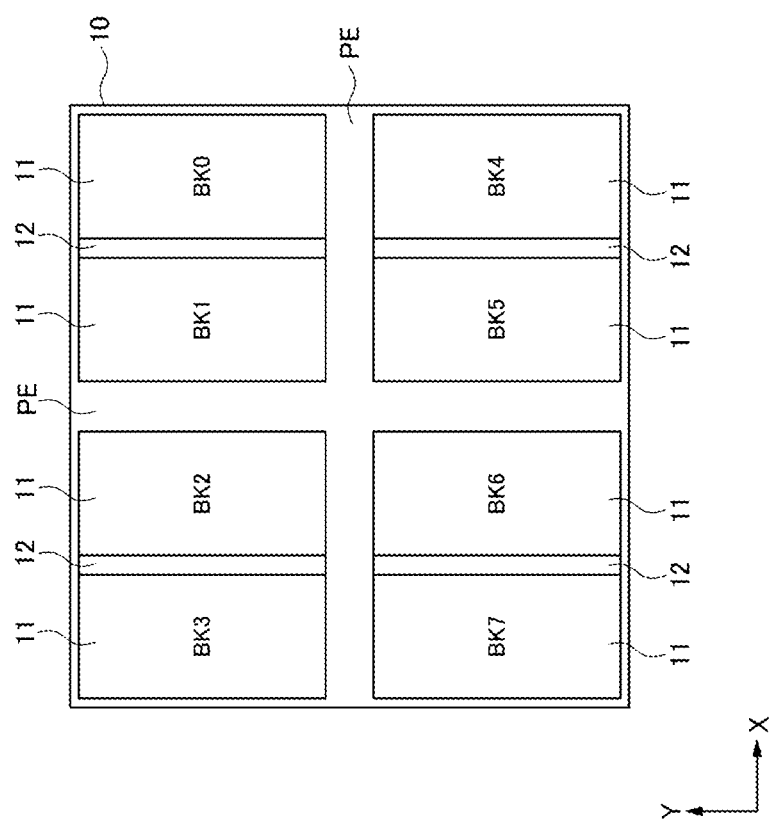
FIG. 2 is a schematic plan view for use in explaining the layout of the semiconductor device.

FIG. 2 is a schematic plan view for use in explaining the layout of the semiconductor device 10 in accordance with the present embodiment.

As shown in FIG. 2, the memory cell array of the present embodiment is divided into eight banks 11 BK0 to BK7. The row decoder 12 is disposed between two banks 11 that are adjacent in the X direction. On the other peripheral circuit region PE, various peripheral circuits and external terminals as shown in FIG. 1 are disposed.

Figure 3:
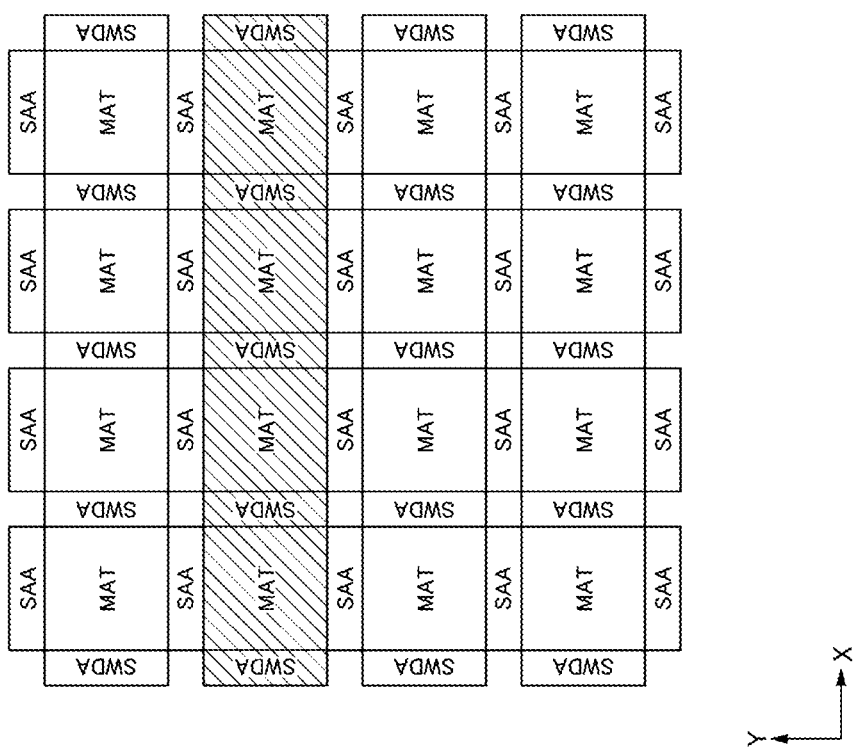
FIG. 3 is an enlarged view for use in explaining a configuration of a bank.

FIG. 3 is an enlarged view for use in explaining the configuration of the bank BK.

As shown in FIG. 3, on each bank BK, a large number of memory mats MAT are laid out in a matrix. Moreover, subword driver rows SWDA are formed on the two sides in the X direction of each memory mat MAT, and sense amplifier rows SAA are formed on the two sides in the Y direction of each memory mat MAT.

On the subword driver row SWDA, a plurality of subword drivers, which will be described later, are disposed, and their operations are controlled by the row decoder 12. When a row address RA is inputted thereto, the row decoder 12 selects the plural subword driver rows SWDA that are aligned in the X direction (that is, having the same Y coordinate value). For example, in FIG. 3, when the plural subword driver rows SWDA indicated by hatched lines are selected, memory mats MAT with hatched lines are selected. In this case, all the other memory mats MAT are non selection.

Moreover, a plurality of sense amplifiers SA are disposed on a sense amplifier row SAA, and the sense amplifiers SA selected by the column decoder 13 are connected to the amplifier circuit 15 shown in FIG. 1.

Figure 4:
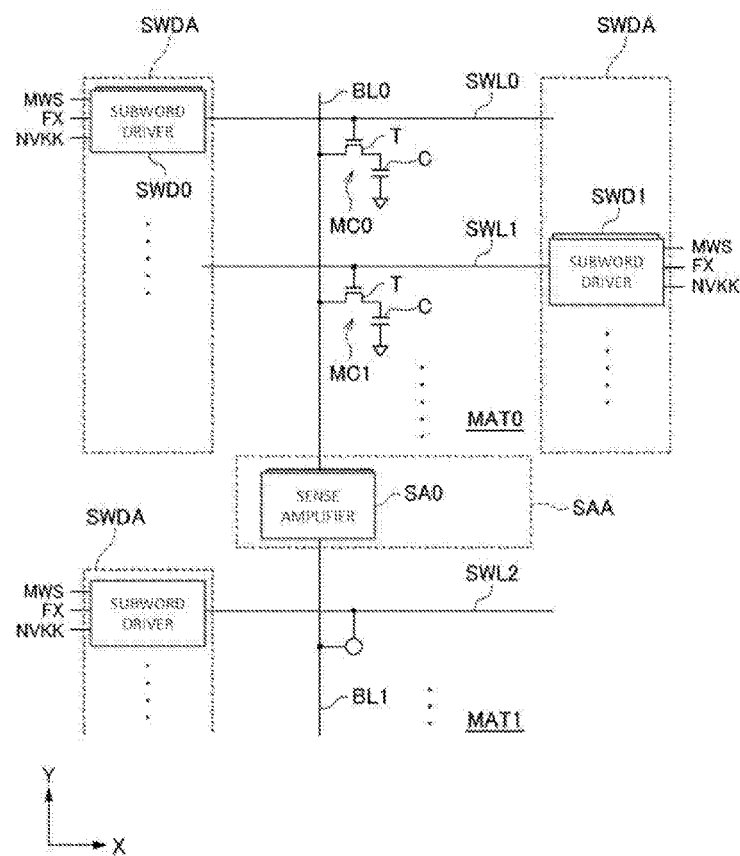
FIG. 4 is a circuit diagram for use in explaining a configuration of a memory mat.

FIG. 4 is a circuit diagram for use in explaining the configuration of the memory mat MAT.

FIG. 4 shows one portion of memory mats MAT0 and MAT1 that are adjacent in the Y direction. As shown in FIG. 4, in each of the memory mats MAT0 and MAT1, the subword lines SWL extend in the X direction and the bit lines BL extend in the Y direction. Additionally, in FIG. 4, two subword lines SWL0 and SWL1 formed in the memory mat MAT0 and one bit line BL0, as well as one subword line SWL2 and one bit line BL1 formed in the memory mat MAT1, are shown.

The subword lines SWL0 and SWL1 are formed so as to be adjacent to each other, and driven by subword drivers SWD0 and SWD1 formed on different subword driver rows SWDA. To these subword drivers SWD, corresponding main word signal MWS, driving signal FX and non-active potential NVKK are supplied. The main word signal MWS and the driving signal FX are signals generated by the row decoder 12 based upon the row address RA. As will be described later, the driving signal FX is a complementary signal composed of FXT and FXB. Moreover, the non-active potential NVKK is either one of the first and second negative potentials VKK1 and VKK2.

Moreover, the bit line BL0 and the bit line BL1 are connected to the same sense amplifier SA0. That is, the semiconductor device 10 in accordance with the present embodiment has a so-called open bit line structure. However, the semiconductor device in accordance with the present invention is not necessarily required to have the open bit line structure, and may have another structure, such as, for example, a folded bit line structure.

The sense amplifier SA0 has a function for amplifying the potential difference between the bit line BL0 and the bit line BL1. For example, in the case when the subword line SWL0 is selected, since the potential of the bit line BL0 is changed by a charge held in the memory cell MC0, this change can be detected by using the bit line BL1 as a reference potential.

The memory cell MC has a configuration in which a cell transistor T and a cell capacitor C are series-connected. In this case, the memory cells MC0 and MC1, shown in FIG. 4, share the bit line BL0, and are memory cells respectively selected by the adjacent subword lines SWL0 and SWL1. It has been known that between these two memory cells, a disturbance phenomenon tends to occur easily.

Figure 5:
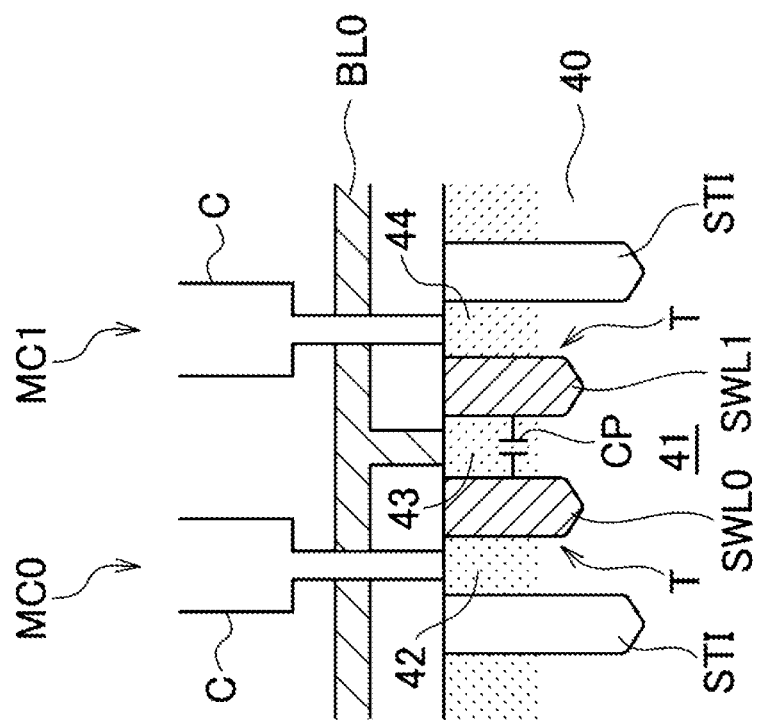
FIG. 5 is a cross-sectional view for use in explaining physical configurations of memory cells.

FIG. 5 is a cross-sectional view for use in explaining the physical structure of the memory cells MC0 and MC1.

As shown in FIG. 5, the cell transistors T of the memory cell MC0, MC1 are formed inside an active region 41 partitioned by element separation regions STI. Each of the cell transistors T has a so-called trench gate configuration in which a gate electrode is embedded in a semiconductor substrate 40. These gate electrodes are respectively constituted by the subword lines SWL0 and SWL1.

Inside the active region 41, three impurity diffusion regions 42 to 44 are formed. Among these, the impurity diffusion regions 42 and 44 located on the end portions are respectively connected to cell capacitors C of the respective memory cells MC0 and MC1, and the impurity diffusion region 43 located in the center is connected to the bit line BL0.

Between the adjacent memory cells MC0 and MC1, a disturbance phenomenon might occur. As has been already explained, the disturbance phenomenon refers to a phenomenon in which when a certain subword line SWL is repeatedly accessed, the information retaining characteristic of a memory cell MC connected to another subword line SWL adjacent to this is lowered. For example, when the subword line SWL0 shown in FIG. 5 is repeatedly accessed, the information retaining characteristic of the memory cell MC1 connected to the subword line SWL1 adjacent to this is lowered. Various theories for the reason for this have been suggested, and for example, the phenomenon is considered to be caused by a parasitic capacitance Cp generated between the adjacent subword lines.

In other words, in the case when a certain subword line SWL0 is repeatedly accessed, since its potential is repeatedly changed from the negative potential NVKK to the high potential VPP, its potential is slightly raised due to a coupling by the parasitic capacitance Cp in spite of the fact that the adjacent subword lines SWL1 are fixed to the negative potential NVKK. Thus, the off-leak current of the cell transistor T connected to the subword line SWL1 increases, with the result that the charge level of the cell capacitor C is rapidly lost in comparison with the normal level.

Moreover, in the case when the subword line SWL0 is changed from the high potential VPP to the negative potential NVKK, since the cell transistor T is changed from "ON" to "OFF", stray electrons forming carriers are generated in the vicinity of the channel. Moreover, when the subword line SWL0 is repeatedly accessed, stray electrons are accumulated, and the accumulated stray electrons are transferred to a capacitor node (impurity diffusion region 44) on the subword line SWL1 side to cause a PN junction leak, with the result that the charging level of the cell capacitor C is lost.

By the mechanism as described above, in the case when a certain sub work line SWL is repeatedly accessed, the information retaining time of memory cells MC connected to the adjacent subword lines SWL is lowered.

In order to prevent the lowering of the information retaining time caused by this disturbance phenomenon, the non-active potential NVKK of the subword line SWL can be further lowered. However, in the case when the non-active potential NVKK of the sub work line SWL is lowered, since the voltage between the gate and drain becomes higher, the GIDL current is undesirably increased. Consequently, the specific level of the non-active potential NVKK needs to be determined by taking both of the disturbance characteristic and the GIDL current into consideration. However, since the disturbance characteristic and the GIDL current are influenced by processing deviations at the time of a manufacturing process, the margin of the non-active potential NVKK becomes different for each of production lots when there is a processing deviation.

Figure 6:
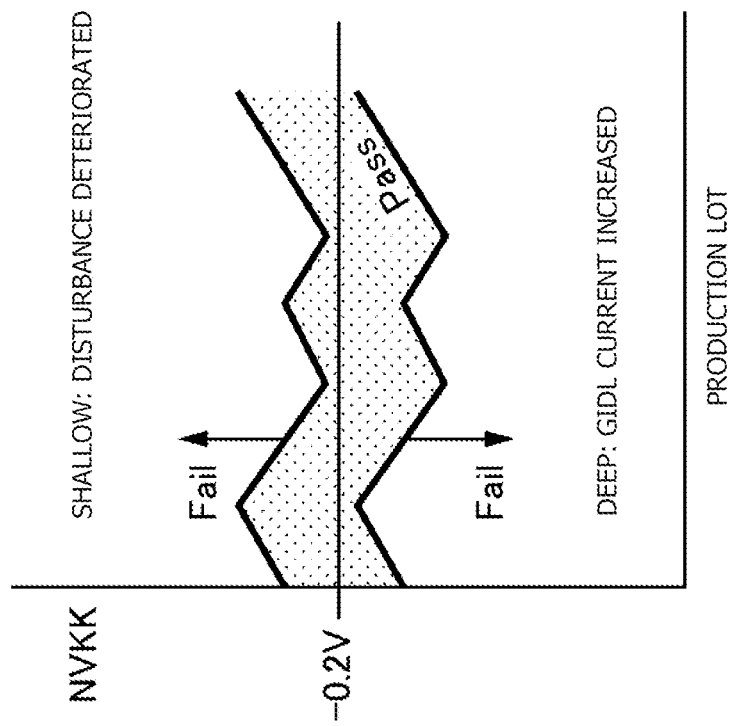
FIG. 6 is a graph for use in explaining a margin of a non-active potential.

FIG. 6 is a graph for use in explaining the margin of the non-active potential NVKK.

In FIG. 6, the axis of ordinates represents the level of the non-active potential NVKK, and the axis of abscissas represents the production lot, and a shaded region Pass represents a range that is appropriate to the non-active potential NVKK. Moreover, the level of the actual non-active potential NVKK is determined so as to be included in the region Pass with respect to all the production lots. For example, in FIG. 6, the non-active potential NVKK is set to −0.2 V.

Figure 7:
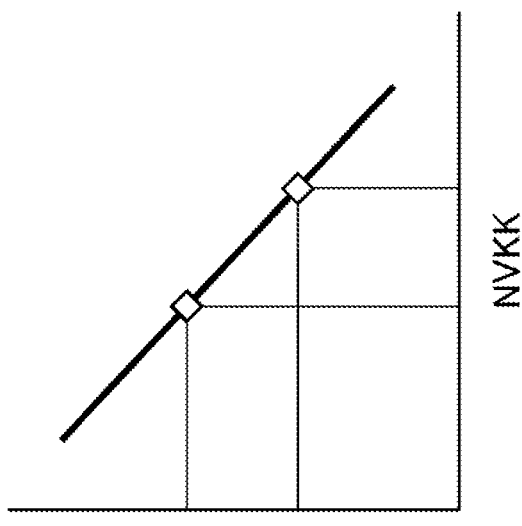
FIG. 7 is a graph for use in explaining a relationship between the level of the non-active potential and information retaining time.

In this case, when the level of the actual non-active potential NVKK is higher than the region Pass (when the level is shallow), it becomes impossible to satisfy a predetermined information retaining characteristic (Fail) due to degradation of the disturbance characteristic. FIG. 7 is a graph for use in explaining the relationship between the level of the non-active potential NVKK and the information retaining time, which indicates that as the non-active potential NVKK becomes higher, the information retaining time is lowered.

Figure 8:
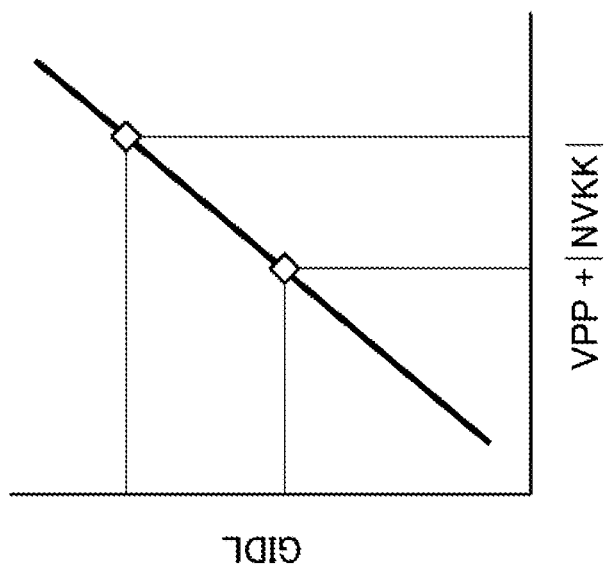
FIG. 8 is a graph for use in explaining a relationship between the levels of the active potential as well as the non-active potential and a GIDL current.

In contrast, when the level of the actual non-active potential is lower than the region Pass (when the level is deep), it becomes impossible to satisfy a predetermined current specification (Fail) due to an increase in the GIDL current. FIG. 8 is a graph for use in explaining the relationship between the levels of the active potential VPP and the non-active potential NVKK (VPP+|NVKK|) and the GIDL current, which indicates that if the active potential VPP is constant, the GIDL current increases as the non-active potential NVKK serving as a negative potential becomes lower.

Therefore, in order to satisfy both of the information retaining characteristic and the current specification, it is necessary to set the level of the non-active potential NVKK within the range of the shaded region Pass; however, as shown in FIG. 6, the level of the region Pass is different depending on the production lots. For this reason, when the difference in the region Pass among the production lots is taken into consideration, the margin of the non-active potential NVKK becomes extremely narrow.

In order to solve these problems, the semiconductor device 10 in accordance with the present embodiment makes the level of the non-active potential NVKK variable by using a selection circuit. The following description will explain this point in detail.

Figure 9:
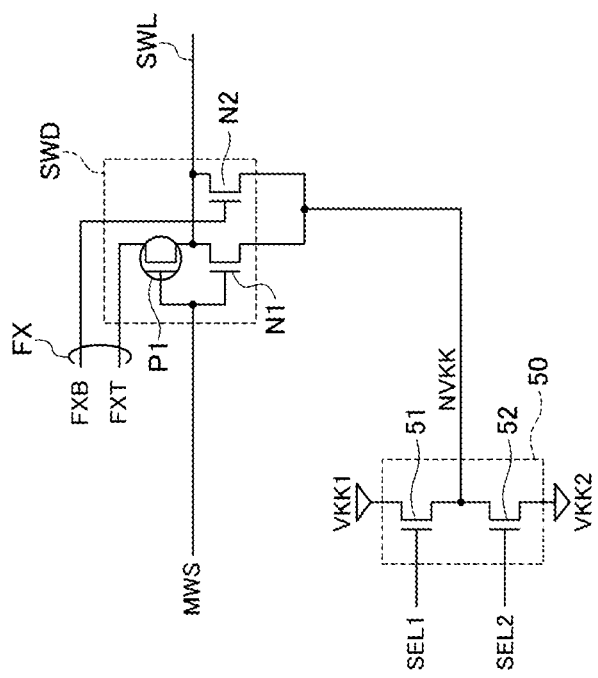
FIG. 9 is a circuit diagram showing a selection circuit in accordance with a first example.

FIG. 9 shows a circuit diagram of a selection circuit 50 in accordance with a first example.

As shown in FIG. 9, the selection circuit 50 in accordance with the first example is constituted by N-channel type MOS transistors 51 and 52. The first negative potential VKK1 is supplied to the source of the transistor 51, and the second negative potential VKK2 (<VKK1) is supplied to the source of the transistor 52. Moreover, a selection signal SEL1 is supplied to the gate electrode of the transistor 51, and a selection signal SEL2 is supplied to the gate electrode of the transistor 52. Thus, the non-active potential NVKK is outputted from each of the drains of the transistors 51 and 52. Therefore, the level of the non-active potential NVKK is set to either one of the negative potentials VKK1 and VKK2 based upon the selection signal SEL1 or SEL2.

The non-active potential NVKK is supplied to each of subword drivers SWD. The subword driver SWD is constituted by a P-channel type MOS transistor P1 and N-channel type MOS transistors N1 and N2. The transistors P1 and N1 are series-connected to each other, and a main word signal MWS is inputted to their gate electrodes. A pair of driving signals FX includes a driving signal FXT and its complementary driving signal FXB. The driving signal FXT is supplied to the source of the transistor P1, and the non-active potential NVKK is supplied to the source of the transistor N1. Moreover, the drains of the transistors P1 and N1 are connected to subword lines SWL. Furthermore, the driving signal FXB is supplied to the gate electrode of the transistor N2, with its drain being connected to the subword line SWL, and the non-active potential NVKK is supplied to its source.

The main word signal MWS is a signal that becomes a low level (VKK2 level) when selected, and the driving signals FXT and FXB are signals that respectively become a high level (VPP level) and the low level (VKK2 level) when selected. Thus, when the main word signal MWS and the driving signals FXT and FXB are activated, the corresponding subword line SWL is driven to the VPP level that is an active potential. In contrast, in the case when at least one of the main word signal MWS and the driving signals FXT and FXB is in the non-activated state, the corresponding subword line SWL is driven to the NVKK level that is the non-active potential. In this case, the level of the actual non-active potential NVKK is controlled to either one of the negative potentials VKK1 and VKK2 based upon the selection signal SEL1 and SEL2.

The selection signals SEL1 and SEL2 are generated by the row decoder 12 shown in FIG. 1. Moreover, for a non selected memory mat MAT, the selection signal SEL1 is activated, and for a selected memory mat MAT, the selection signal SEL2 is activated. For example, of the memory mats MAT shown in FIG. 3, for non selected memory mats MAT having no hatched lines, the selection signal SEL1 is activated, while for selected memory mats MAT indicated by hatched lines, the selection signal SEL2 is activated. As a result, in the non selected memory mats MAT, the first negative potential VKK1 is supplied to all the subword lines SWL, while in the selected memory mats MAT, the high potential VPP is applied to the selected subword lines SWL, and to the other subword lines SWL, the second negative potential VKK2 is applied.

Figure 10:
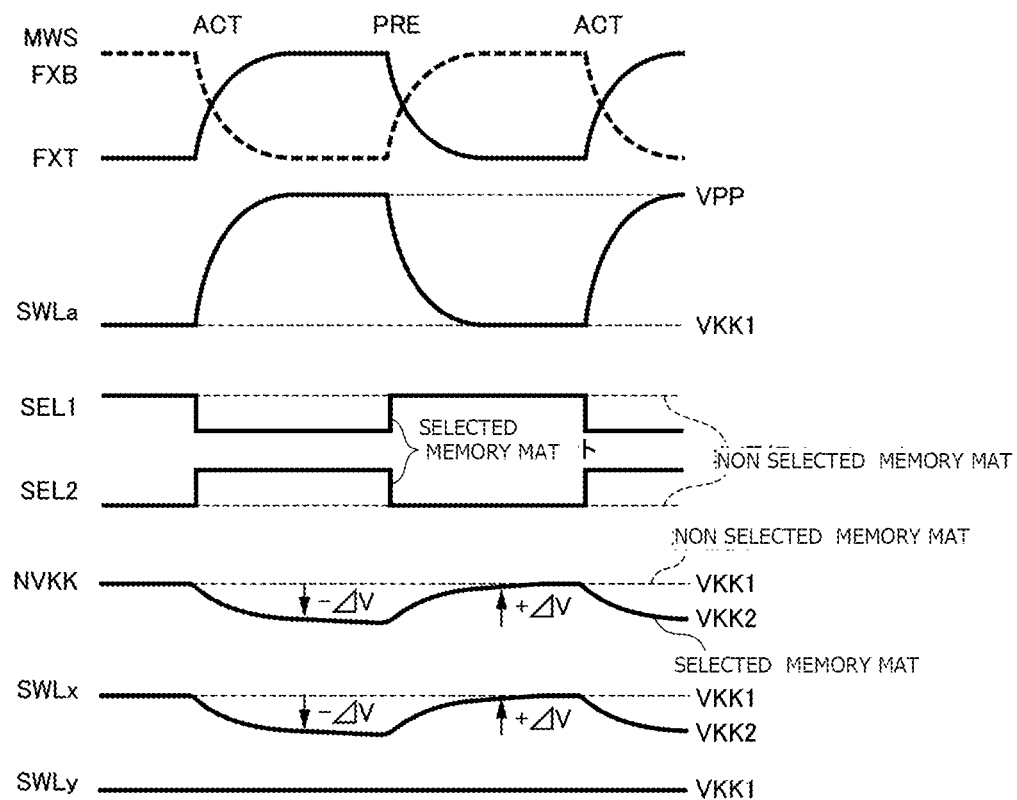
FIG. 10 is a timing diagram for use in explaining operations of the selection circuit of FIG. 9.

FIG. 10 is a timing diagram for use in explaining operations of the selection circuit 50.

In FIG. 10, a reference symbol SWLa represents a potential of a selected subword line SWL, a reference symbol SWLx represents a potential of a non selected subword line SWL inside a selected memory mat MAT, and reference symbol SWLy represents a potential of a subword line SWL inside a non selected memory mat MAT. Moreover, with respect to the selection signals SEL1, SEL2 and the non-active potential NVKK, a level corresponding to the selected memory mat MAT is indicated by a solid line, and a level corresponding to the non selected memory mat MAT is indicated by a broken line.

As shown in FIG. 10, when an active command ACT and a precharge command PRE are alternately issued from the outside, the main word signal MWS and driving signals FXT and FXB associated with the selected subword line SWL are changed in cooperation with these commands. As a result, as indicated by the reference symbol SWLa, the selected subword line SWL becomes a high potential VPP during an active period, and during a precharge period, it becomes a negative potential VKK1. The reason that the subword line SWL becomes the negative potential VKK1 during the precharge period is because during the precharge period, the selection signal SEL1 is always activated.

On the other hand, as indicated by the reference symbol SWLx, the non selected subword line SWL within the selected memory mat MAT becomes a negative potential VKK2 during the active period, and during the precharge period, it becomes the negative potential VKK1. In other words, when the active command ACT is issued, the level of the non-active potential NVKK is lowered by $\Delta V$ (=VKK1−VKK2), which is represented as "↓−$\Delta V$" in FIG. 10, and when the precharge command PRE is issued, the level of the non-active potential NVKK is raised by $\Delta V$, which is represented as "↑+$\Delta V$" in FIG. 10. The reason that the subword line SWL becomes the negative potential VKK2 during the active period is because during the active period, the selection signal SEL2 associated with the selected memory mat MAT is activated.

Moreover, as indicated by a reference symbol SWLy, the subword line SWL within the non selected memory mat MAT is always fixed to the negative potential VKK1. The reason for this is because in the non selected memory mat MAT, the selection signal SEL1 is always activated.

In accordance with the above-mentioned operations, during the active period, the non selected subword line SWL belonging to the selected memory mat MAT becomes the negative potential VKK2 (<VKK1), while the subword line SWL belonging to the non selected memory mat MAT becomes the negative potential VKK1. As a result, with respect to the selected memory mat MAT wherein the disturbance phenomenon occurs, since a greater negative potential is given thereto, the disturbance phenomenon is effectively suppressed, while with respect to the non selected memory mat MAT wherein no disturbance phenomenon occurs, since the level of the negative potential is suppressed, the GIDL current is reduced.

With this arrangement, even in the case of a narrow margin of the non-active potential NVKK, it becomes possible to satisfy both of maintaining a good disturbance characteristic and suppressing the GIDL current.

Figure 11:
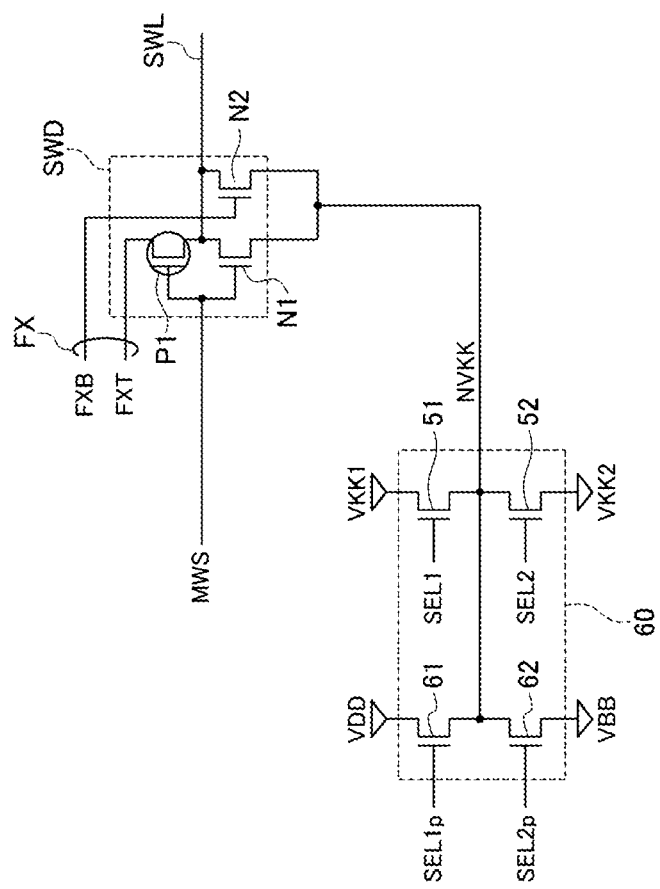
FIG. 11 is a circuit diagram showing a selection circuit in accordance with a second example.

FIG. 11 is a circuit diagram showing a selection circuit 60 in accordance with a second example.

As shown in FIG. 11, the selection circuit 60 of the second example is different from the selection circuit 50 of the first example in that N-channel type MOS transistors 61 and 62 are added thereto. A power supply potential VDD is supplied to the drain of the transistor 61, and a substrate potential VBB (<VKK2) is supplied to the source of the transistor 62. Moreover, a selection signal SEL1p is supplied to the gate electrode of the transistor 61, and a selection signal SEL2p is supplied to the gate electrode of the transistor 62. The source of the transistor 61 and the drain of the transistor 62 are connected to the drains of transistors 51 and 52.

The selection signal SEL1p and SEL2p are generated by the row decoder 12 shown in FIG. 1. Moreover, the selection signal SEL1p is activated immediately before the activation of the selection signal SEL1, and the selection signal SEL2p is activated immediately before the activation of the selection signal SEL2.

Figure 12:
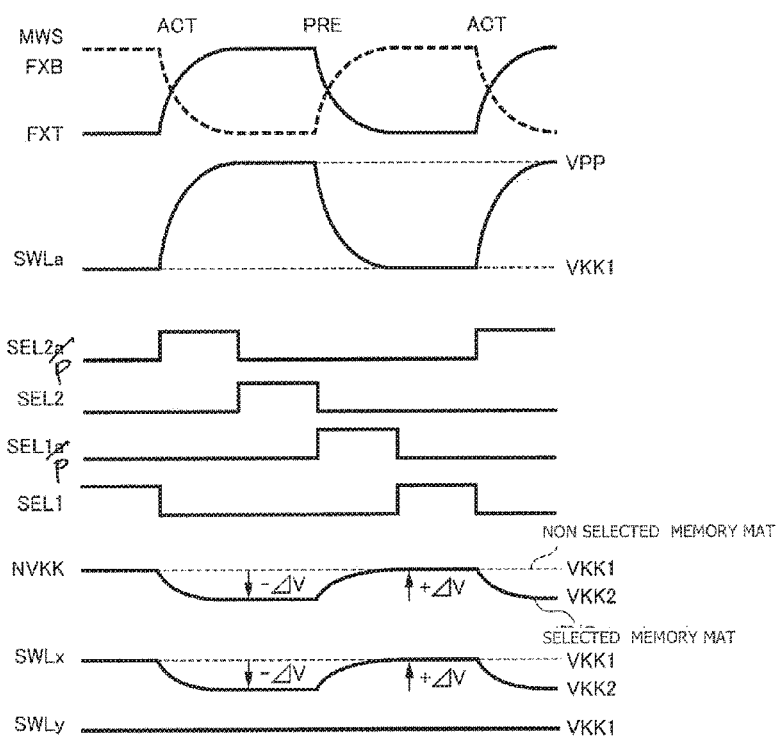
FIG. 12 is a timing diagram for use in explaining operations of the selection circuit of FIG. 11.

FIG. 12 is a timing diagram for use in explaining operations of the selection circuit 60.

Each of selection signals SEL1, SEL1p, SEL2 and SEL2p has a waveform associated with the selected memory mat MAT. Moreover, in the same manner as in FIG. 10, as indicated by the reference symbol SWLa, the selected subword line SWL is varied within a range between the high potential VPP and the negative potential VKK1.

Moreover, the potential of the other subword lines SWL is also varied basically as explained by using FIG. 10; however, the non-active potential NVKK is overdriven by the activation of each of the selection signals SEL1p and SEL2p. That is, since the selection signal SEL2p is activated immediately before the activation of the selection signal SEL2, the non-active potential NVKK is overdriven from the negative potential VKK1 toward the minus direction, which is represented as "↓−ΔV" in FIG. 12, so that the level of the non-active potential NVKK is consequently allowed to quickly reach the negative potential VKK2. Moreover, since the selection signal SEL1p is activated immediately before the activation of the selection signal SEL1, the non-active potential NVKK is overdriven from the negative potential VKK2 toward the plus direction, which is represented as "↑+ΔV" in FIG. 12, so that the level of the non-active potential NVKK is consequently allowed to quickly reach the negative potential VKK1.

In this manner, by using the selection circuit 60, it becomes possible to quickly switch the level of the non-active potential NVKK. Additionally, in the example shown in FIG. 11, the power supply potential VDD and the substrate potential VBB are used for the overdriving process; however, another potential may be used as long as it can carry out the overdriving process. In this case, with respect to the negative potential VKK1, the potential capable of carrying out the overdriving process indicates a potential higher than the negative potential VKK1, and with respect to the negative potential VKK2, it indicates a potential lower than the negative potential VKK2.

Figure 13:
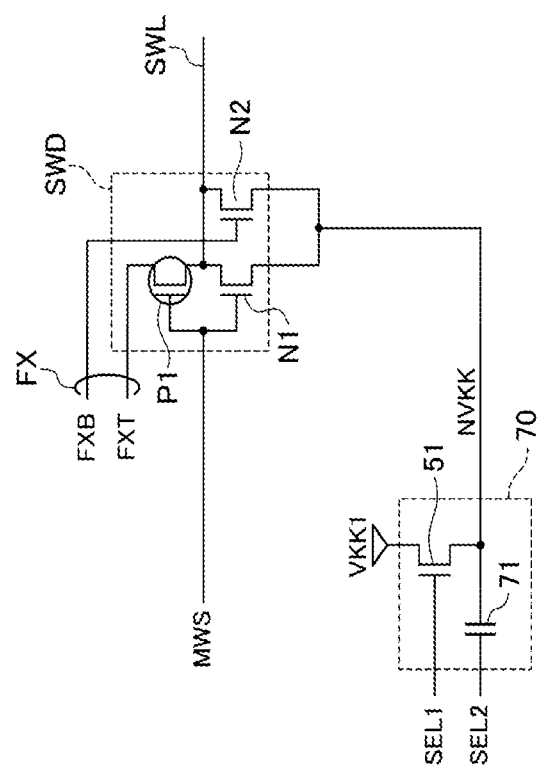
FIG. 13 is a circuit diagram showing a selection circuit in accordance with a third example.

FIG. 13 is a circuit diagram showing a selection circuit 70 in accordance with a third example.

As shown in FIG. 13, the selection circuit 70 of the third example is different from the selection circuit 50 of the first example in that the transistor 62 is replaced by a capacitor 71. The capacitor 71 has its one end connected to the drain of the transistor 51, with a selection signal SEL2 being supplied to the other end.

Figure 14:
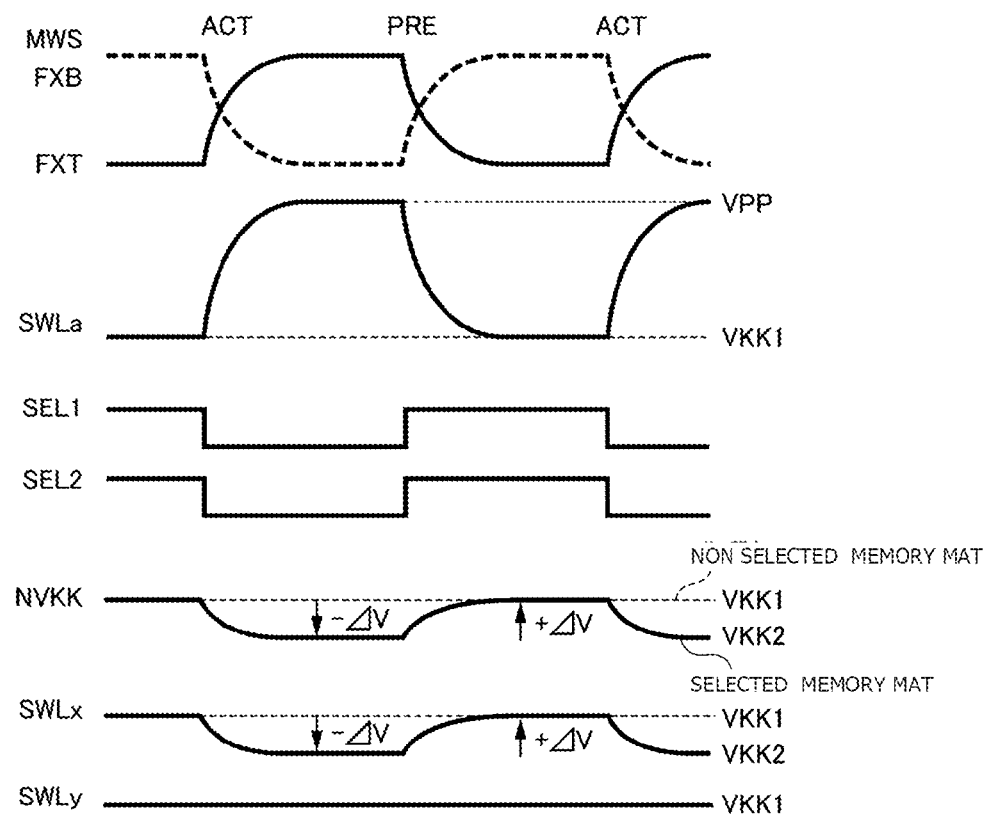
FIG. 14 is a timing diagram for use in explaining operations of the selection circuit of FIG. 13.

FIG. 14 is a timing diagram for use in explaining operations of the selection circuit 70.

As shown in FIG. 14, in the present example, when the transistor 51 is turned off, the selection signal SEL2 is set to a low level, and when the transistor 51 is turned on, the selection signal SEL2 is set to a high level. With this arrangement, during the active period, by the pumping process by the capacitor 71, the level of the non-active potential NVKK is pushed down from the negative potential VKK1 to the negative potential VKK2, which is represented as "↓−ΔV" in FIG. 14.

In accordance with the present example, without the necessity of generating the negative potential VKK2 by using the power supply circuit 30, the level of the non-active potential NVKK can be switched (e.g., represented as "↓−ΔV" and "↑+ΔV" in FIG. 14). Moreover, since the level of the non-active potential NVKK is switched by the pumping of the capacitor 71, it becomes possible to cut a current consumption caused by the charging/discharging process.

Figure 15:
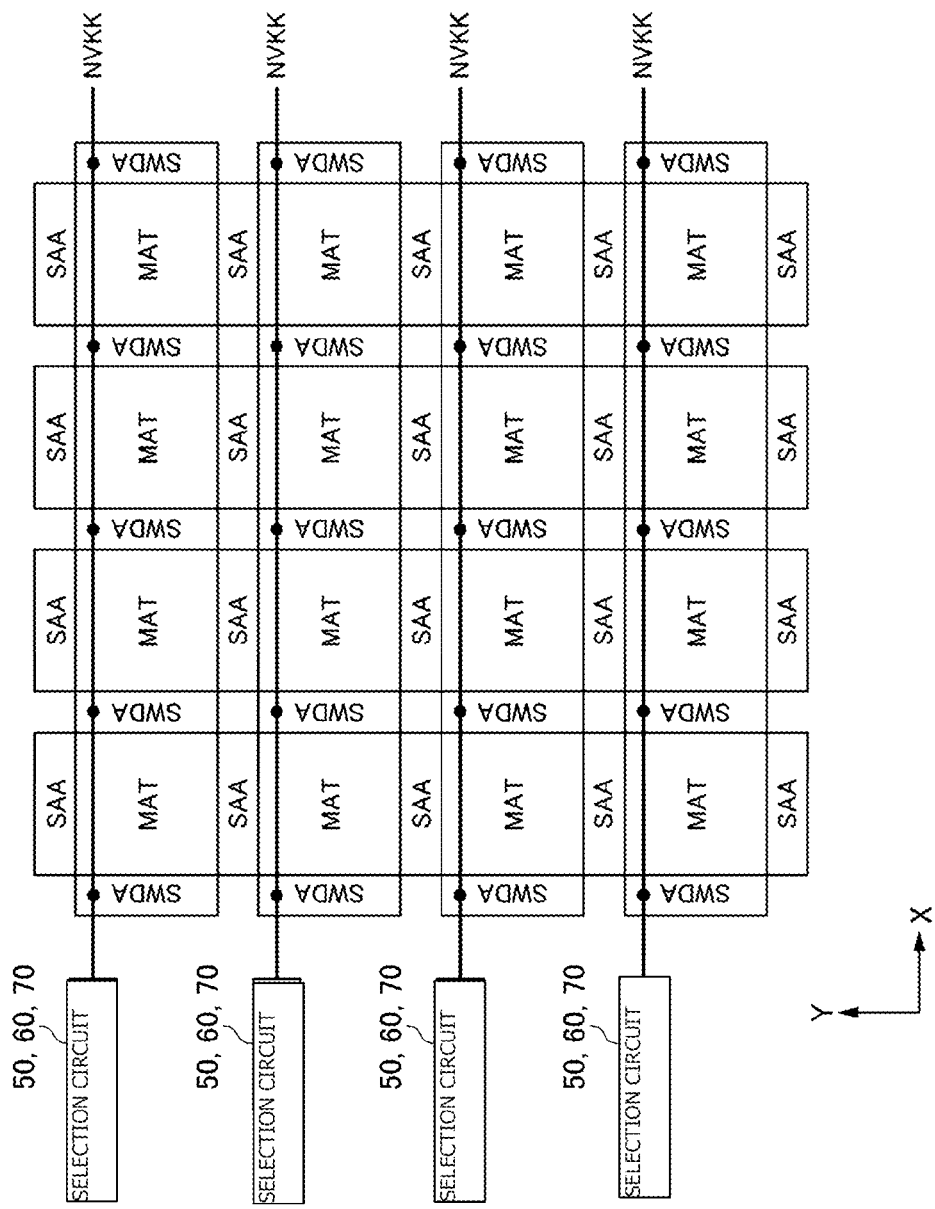
FIG. 15 is diagram for use in explaining a first example of a method for assigning the selection circuit of FIGS. 9-14.

FIG. 15 is a view for use in explaining a first example of a method for assigning the selection circuit 50, 60 or 70.

In the example shown in FIG. 15, a selection circuit 50, 60 or 70 is assigned to a plurality of subword driver rows SWDA aligned in the X direction (that is, having the same Y coordinate value). In accordance with this assigning method, the number of the selection circuit 50, 60 or 70 can be set to the minimum value required.

Figure 16:
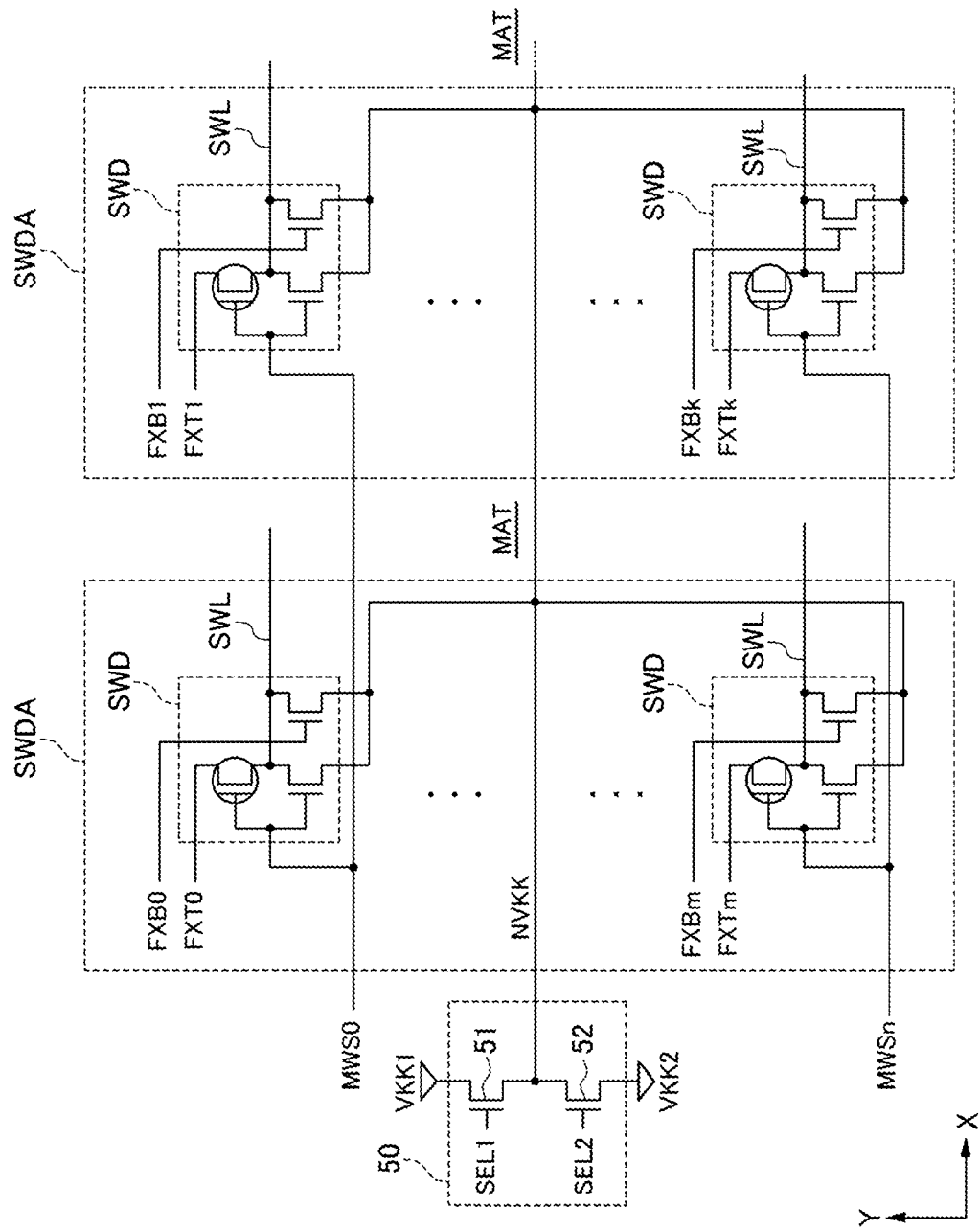
FIG. 16 shows a specific circuit diagram in the case when the selection circuit of FIG. 9 is assigned based upon the assigning method in accordance with the first example.
Figure 17:
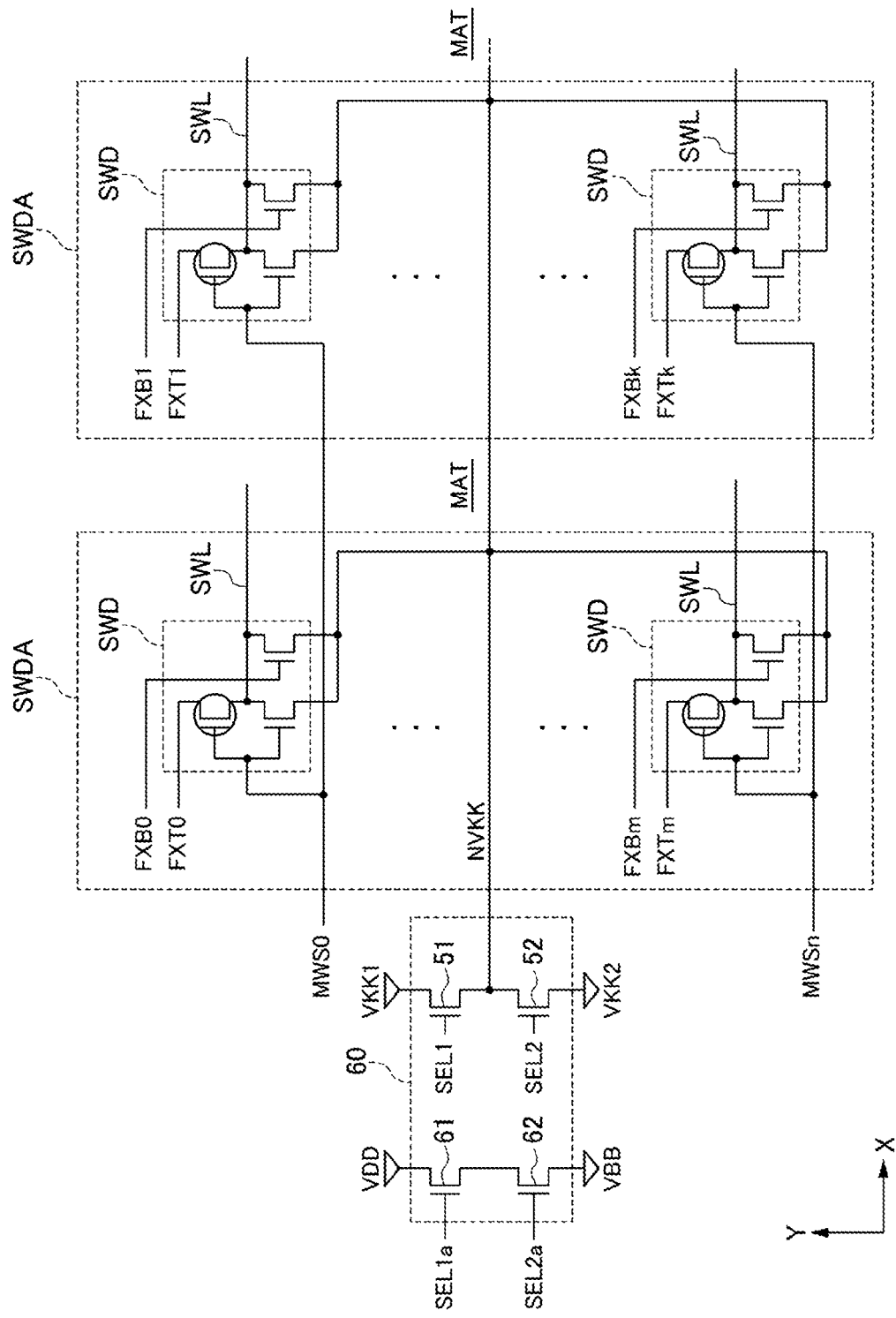
FIG. 17 shows a specific circuit diagram in the case when the selection circuit of FIG. 11 is assigned based upon the assigning method in accordance with the first example.
Figure 18:
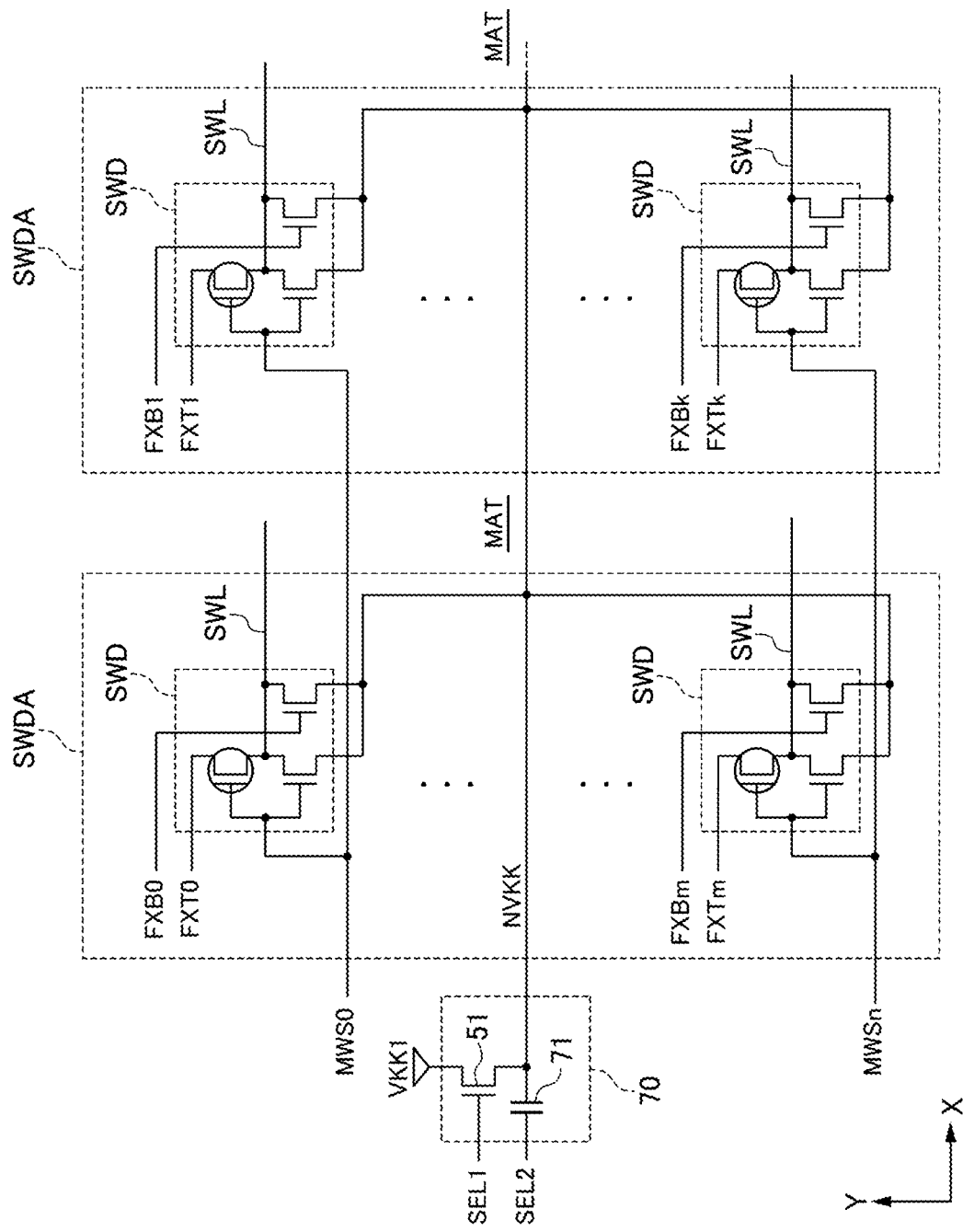
FIG. 18 shows a specific circuit diagram in the case when the selection circuit of FIG. 13 is assigned based upon the assigning method in accordance with the first example.

FIGS. 16 to 18 show specific circuit diagrams in which the respective selection circuits 50, 60 and 70 are assigned based upon the assigning method of the first example.

As shown in FIGS. 16 to 18, in the case when the assigning method of the first example is used, one of the selection circuits 50, 60 and 70 is assigned to all the subword drivers SWD included in the plural subword driver rows SWDA aligned in the X direction. Therefore, the common non-active potential NVKK is supplied to all the subword drivers SWD. Additionally, in the case of using the selection circuit 70, the capacitor 71 may be disposed in a formation area for the row decoder 12. With this arrangement, since no capacitor 71 needs to be installed in the formation area of the memory cell array 11, it is not necessary to alter the design of the memory cell array 11.

Figure 19:
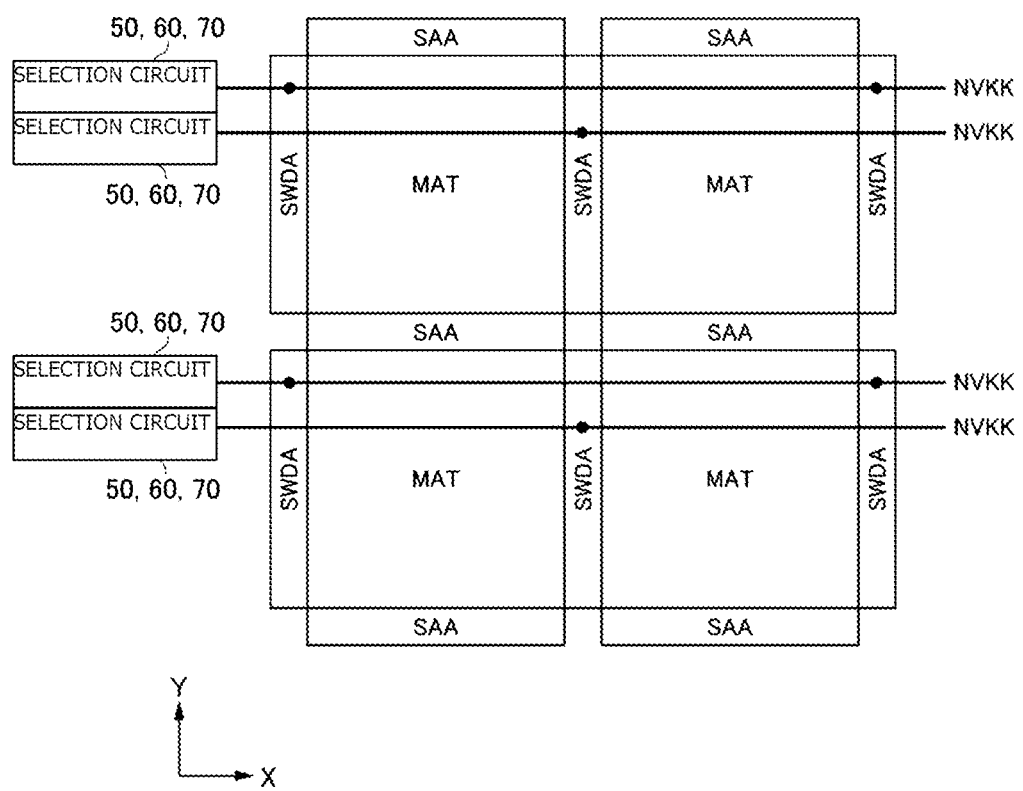
FIG. 19 is diagram for use in explaining a second example of the method for assigning the selection circuit FIGS. 9-14.

FIG. 19 shows a view for use in explaining a second example of a method for assigning the selection circuit 50, 60 or 70.

In the example shown in FIG. 19, two of the selection circuits 50, 60 or 70 are assigned to a plurality of subword driver rows SWDA aligned in the X direction (that is, having the same Y coordinate value). Moreover, one of the selection circuits 50, 60 or 70 is assigned to each of odd-numbered subword driver rows SWDA, and the other one of the selection circuits 50, 60 or 70 is assigned to each of the even-numbered subword driver rows SWDA. In accordance with this assigning method, the level of the non-active potential NVKK can be switched at a high speed since the load for each one of the selection circuits 50, 60 and 70 becomes smaller.

In the case of a specification in which every other memory mat MAT of the plural memory mats MAT aligned in the X direction is selected (for example, in which even-numbered memory mats MAT are selected, with odd-numbered memory mats being non selected), of the plural memory mats MAT aligned in the X direction, the negative potential VKK2 can be supplied to the selected memory mats MAT, with the negative potential VKK1 being supplied to the non selected memory mats MAT.

Additionally, the assigning method in the present example may be particularly desirable in the configuration using the selection circuit 70.

Figure 20:
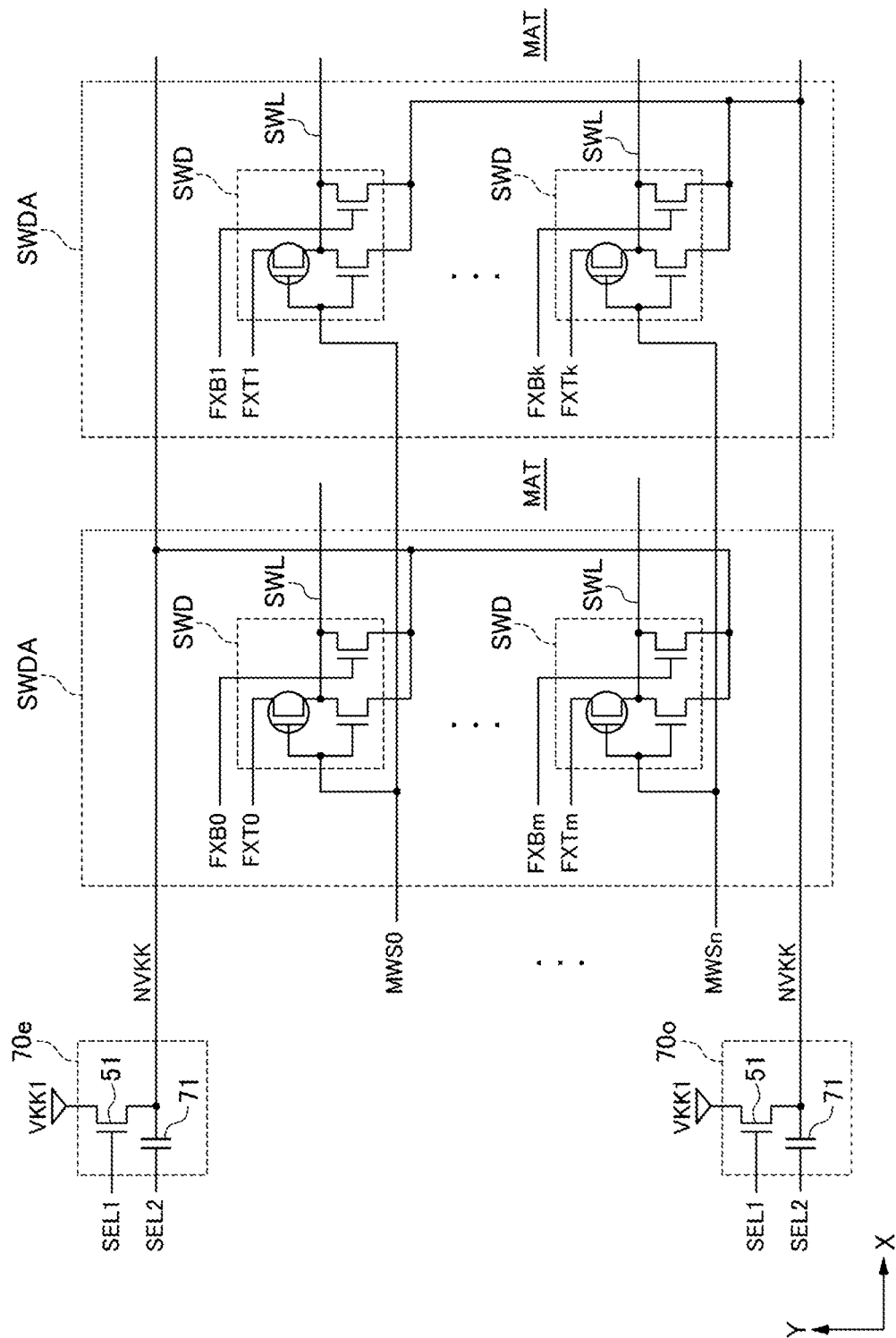
FIG. 20 shows a specific circuit diagram in the case when the selection circuit of FIG. 13 is assigned based upon the assigning method in accordance with the second example.

FIG. 20 shows a specific circuit diagram in which the selection circuits 70 are assigned based upon the assigning method of the second example.

In the example shown in FIG. 20, selection circuits 70e assigned to even-numbered subword driver rows SWDA and selection circuits 70o assigned to odd-numbered subword driver rows SWDA are provided, and the capacitors 71 included therein are disposed in the formation areas of the row decoders 12.

Figure 21:
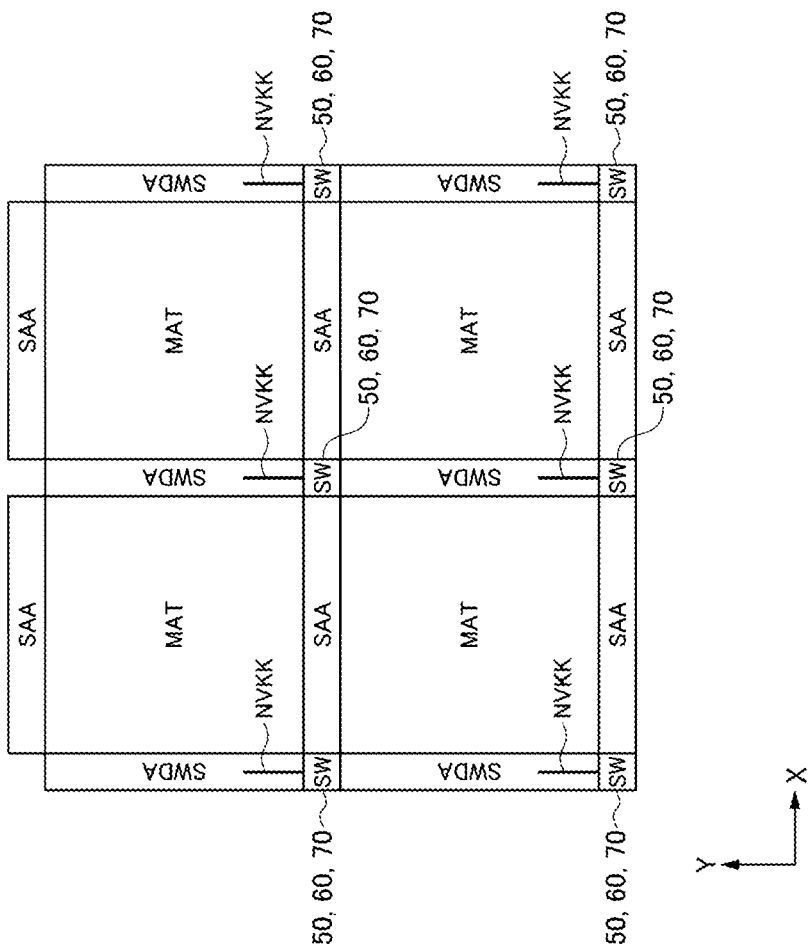
FIG. 21 is a diagram for use in explaining a third example of the method for assigning the selection circuit FIGS. 9-14.

FIG. 21 is a view for use in explaining a third example of the assigning method of the selection circuits 50, 60 or 70.

In the example shown in FIG. 21, one selection circuit 50, 60 or 70 is assigned to the single subword driver row SWDA. In accordance with this assigning method, since the load for the one selection circuit 50, 60 or 70 becomes smaller, the level of the non-active potential NVKK can be switched at a high speed.

Figure 22:
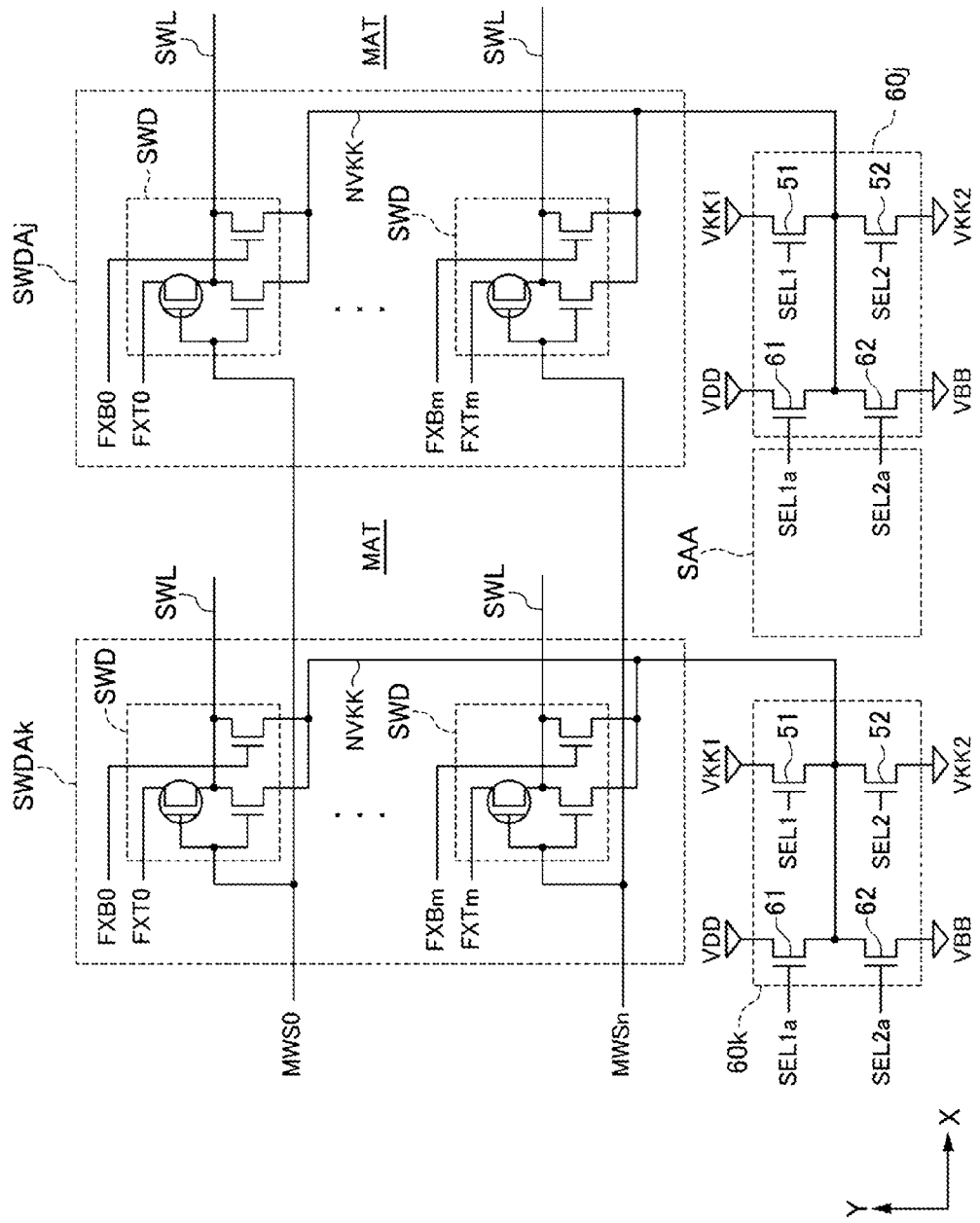
FIG. 22 shows a specific circuit diagram in the case when the selection circuit of FIG. 11 is assigned based upon the assigning method in accordance with the third example.

FIG. 22 shows a specific circuit diagram in which the selection circuits 60 are assigned based upon the assigning method of the third example.

FIG. 22 shows two subword driver rows SWDAk and SWDAj aligned in the X direction (that is, having the same Y coordinate value), and to these, selection circuits 60k and 60j are respectively assigned. Since these selection circuits 60k and 60j have the aforementioned over-driving function, the level of the non-active potential NVKK can be switched at a very high speed. Additionally, since the selection circuits 60k and 60j are assigned to the subword driver rows SWDAk and SWDAj aligned in the X direction, they are commonly controlled.

Figure 23:
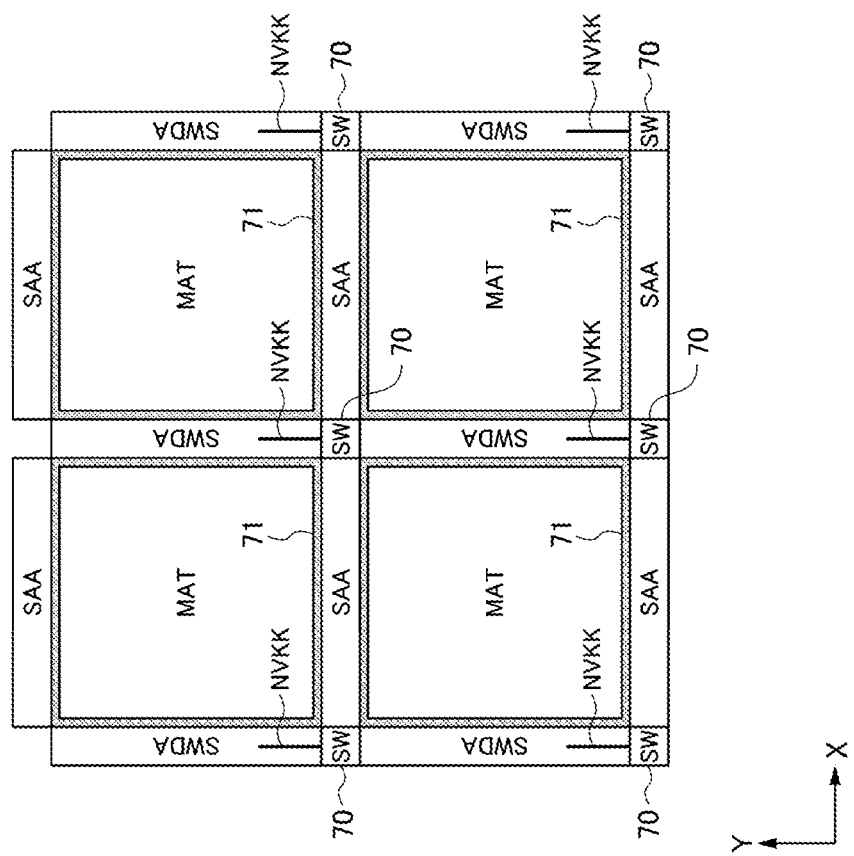
FIG. 23 is a view for use in explaining a layout of a capacitor in the case when the selection circuit of FIG. 13 is assigned based upon the assigning method in accordance with the third example.

FIG. 23 is a view for use in explaining the layout of the capacitors 71 in the case when the selection circuits 70 are assigned based upon the assigning method of the third example. Moreover, FIG. 24 shows the corresponding circuit diagram.

As shown in FIG. 23, in the present example, the capacitors 71 are disposed on the periphery of the corresponding memory mats MAT. In accordance with this arrangement, since it is possible to suppress a capacity required for one capacitor 71, the capacitor 71 is prevented from occupying a large area on the chip.

Figure 24:
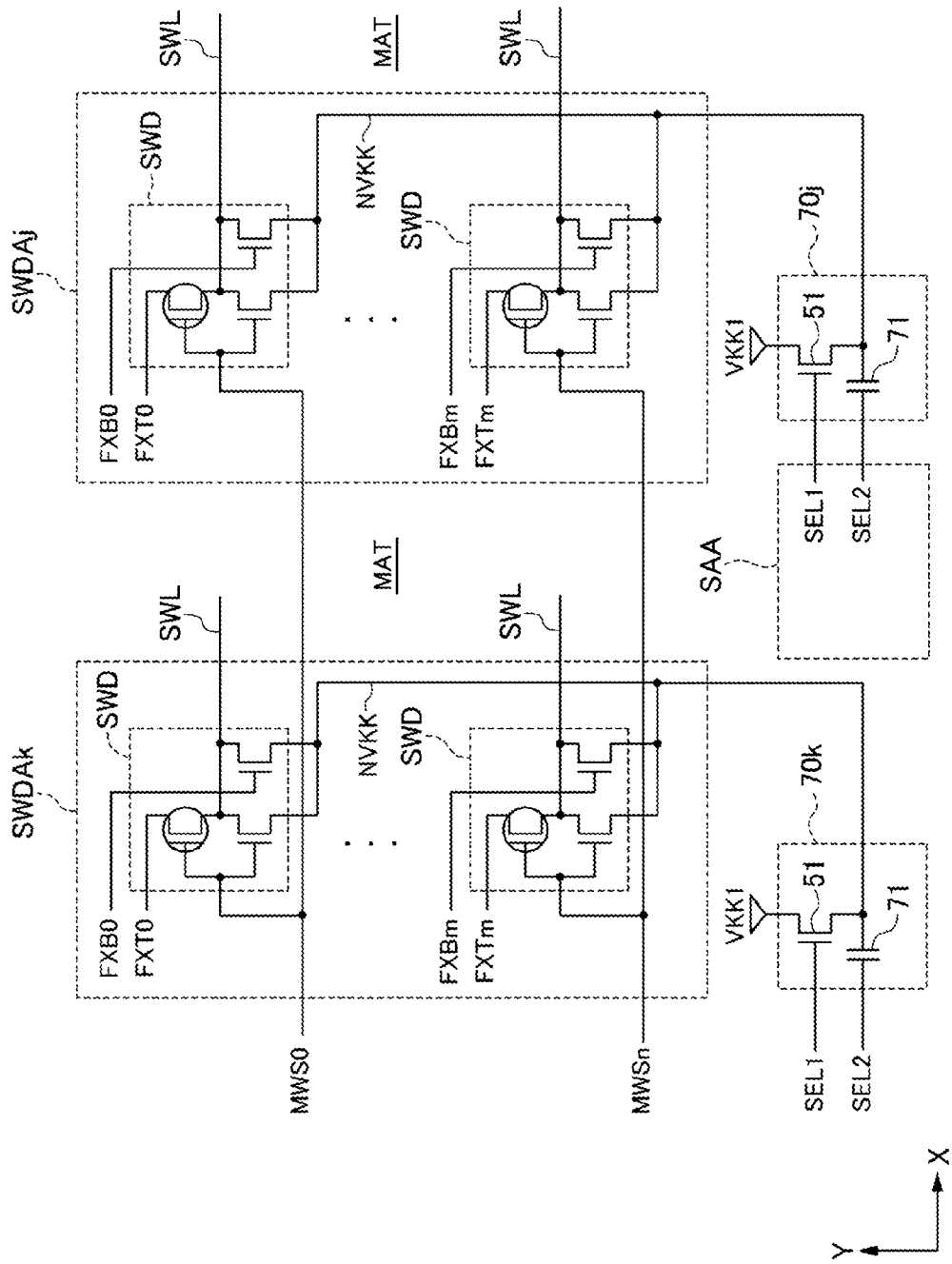
FIG. 24 is a circuit diagram in the case when the layout of FIG. 23 is adopted.

Moreover, FIG. 24 shows two subword driver rows SWDAk and SWDAj aligned in the X direction (that is, having the same Y coordinate value), and to these, selection circuits 70k and 70j are respectively assigned. Since these selection circuits 70k and 70j are assigned to the subword driver rows SWDAk and SWDAj aligned in the X direction, they are commonly controlled.

Figure 25:
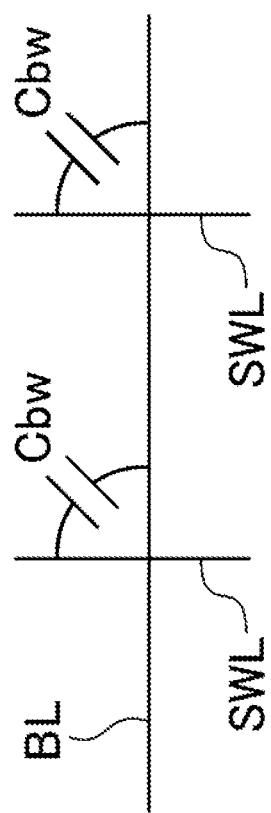
FIG. 25 is a diagram for use in explaining a capacitive component generated between a subword line and a bit line.

FIG. 25 is a diagram for use in explaining a capacitive component generated between the subword line SWL and the bit line BL.

As shown in FIG. 25, since the subword line SWL and the bit line BL intersect with each other, a predetermined capacitive component Cbw is generated between the two members. In the present embodiment, since the non selected subword line SWL inside the selected memory mat MAT is set to the negative potential VKK2 (<VKK1), the non selected subword line SWL is pulled in the minus direction in comparison with the state in which the non selected subword line SWL is set to the negative potential VKK1.

Figure 26:
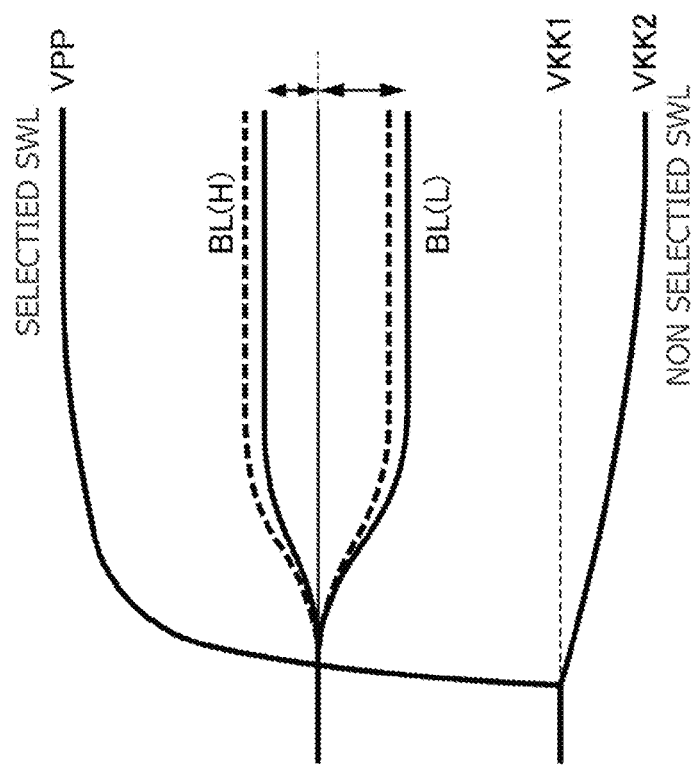
FIG. 26 is a graph showing a potential change in the bit line.

FIG. 26 is a graph showing a potential change in the bit line BL, in which a solid line indicates the example of the present embodiment and a broken line indicates that of a comparative example.

As shown in FIG. 26, when a predetermined subword line SWL is selected in the present embodiment, the potential of the bit line BL is pulled in the minus direction "BL(L)" in comparison with the comparative example "BL(H)". This is because in contrast to the comparative example in which the non selected subword line SWL inside the selected memory mat MAT is set to the negative potential VKK1, in the present embodiment, the non selected subword line SWL inside the selected memory mat MAT is set to the negative potential VKK2 (<VKK1). With this configuration, in the case when information in a low level is maintained in the memory cell MC, since the level of the bit line BL is more greatly lowered "BL(L)", the signal amount thereof is increased. Therefore, in the case when the signal amount of the bit line BL at the time of reading the information of the low level from the memory cell MC becomes insufficient, the semiconductor device 10 in accordance with the present embodiment exerts an effect for compensating for this insufficiency.

The preferred embodiments of the present invention have been described above; however, the present invention is not intended to be limited only by the above-mentioned embodiments, and it is needless to say that various modifications may be made therein within a scope not departing from the gist of the present invention, and that those modifications are included in the scope of the present invention.

For example, in the above-mentioned embodiments, the non-active potential NVKK of the subword line SWL is set to either the negative potential VKK1 or VKK2; however, the kinds of the non-active potential are not intended to be limited by these, and three or more kinds of different non-active potentials may be prepared, and any one of these may be selected.

Moreover, in the above-mentioned embodiments, the level of the non selected subword lines SWL within the selected memory mat MAT is set to all the same second negative potential VKK2; however, the present invention is not intended to be limited by this, and only one portion of the non selected subword lines SWL that are subjected to the influences of a disturbance phenomenon may be set to the second negative potential VKK2, with the rest thereof being set to the first negative potential VKK1

What is claimed is:

1. A semiconductor device comprising:
   a plurality of subword lines;
   a plurality of bit lines;
   a plurality of memory cells, each arranged at intersection positions of the plurality of subword lines and the plurality of the bit lines;
   a plurality of subword driver circuits, each coupled to associated one of the subword lines and configured to supply one of a first non selection potential, a second non selection potential lower than the first non selection potential and a third selection potential different from the first and second non selection potentials; and a select circuit configured to supply at least one of the first and second non selection potentials to a second node, wherein the select circuit comprises:
   a first transistor coupled between a first potential line and the second node, the first potential line configured to supply the first non selection potential;
   a second transistor coupled between a second potential line and the second node, the second potential line configured to supply the second non selection potential;
   a third transistor coupled between a third potential line and the second node, the third potential line configured to supply a third non selection potential that is higher than the first non selection potential; and
   a fourth transistor coupled between a fourth potential line and the second node, the fourth potential line configured to supply a fourth non selection potential that is lower than the second non selection potential.

2. The semiconductor device as claimed in claim 1, wherein
each of the plurality of subword driver circuits includes a fifth transistor coupled between a first node supplying one of complementary drive signals and an associated one of the plurality of subword lines, a sixth transistor coupled between the associated one of the plurality of subword lines and the second node, each control terminal of the fifth and sixth transistors receiving an associated one of a plurality of main word signals, a seventh transistor coupled between the associated one of the plurality subword lines and the second node, and the seventh transistor including a control terminal receiving an other of the complementary drive signals.

3. The semiconductor device as claimed in claim 1, wherein each of the first and second non selection potentials is a negative potential and the third selection potential is a positive potential.

4. The semiconductor device as claimed in claim 1, wherein each of the plurality of memory cells includes:
   a transistor including a control terminal coupled to an associated one of the plurality of subword lines, and
   a storage element,
   wherein the transistor and the storage element coupled in series to an associated one of the plurality of bit lines.

5. The semiconductor device as claimed in claim 1, wherein the third non selection potential is a power supply potential, and
wherein the fourth non selection potential is a substrate potential.

6. The semiconductor device as claimed in claim 1, wherein
the first transistor is configured to receive a first selection signal,
wherein the second transistor is configured to receive a second selection signal,
wherein the third transistor is configured to receive a third selection signal, and
wherein the fourth transistor is configured to receive a fourth selection signal.

7. A semiconductor device comprising:
a first subword line coupled to a memory cell;
a first subword driver circuit coupled to the first subword line, the first subword driver circuit configured to supply at least one of a first negative potential and a second negative potential different from the first negative potential to the first subword line; and
a select circuit configured to supply at least one of the first negative potential and the second negative potential to a second node coupled to the first subword driver circuit,
wherein the select circuit includes a first transistor coupled between a first potential line and the second node, the first potential line configured to supply the first negative potential,
wherein the select circuit further includes a capacitor having one end coupled to a drain node of the first transistor at the second node, with a first selection signal being supplied to another end, and
wherein the first subword driver circuit is configured to supply a potential on the second node to the first subword line.

8. The semiconductor device as claimed in claim 7, wherein the first subword driver circuit is configured to supply one of the first negative potential, the second negative potential, a third positive potential different from the first and second negative potentials.

9. The semiconductor device as claimed in claim 7, wherein the memory cell includes:
   a transistor including a control terminal coupled to the subword line, and
   a storage element,
   wherein the transistor and the storage element coupled in series to a bit line.

10. The semiconductor device as claimed in claim 7, wherein the first subword driver circuit is configured to supply at least one of the responsive to a main word signal and complementary drive signals.

11. The semiconductor device as claimed in claim 7, wherein the capacitor is configured to change a potential level of the second node from the first negative potential to the second negative potential responsive to the first selection signal when the first transistor is turned off.

12. A semiconductor device comprising:
   a first subword line;
   a first memory cell coupled to the first subword line;
   a first subword driver circuit coupled to the first subword line to drive the first subword line; and
   a selection circuit coupled to the first subword driver circuit and configured to supply at least one of a first potential, and a second potential lower than the first potential,
wherein the selection circuit includes:
   a first transistor coupled between a first potential line and a second node, the first potential line configured to supply the first potential;
   a second transistor coupled between a second potential line and the second node, the second potential line configured to supply the second potential;
   a third transistor coupled between a third potential line and the second node, the third potential line configured to supply a third potential higher than the first potential; and
   a fourth transistor coupled between a fourth potential line and the second node, the fourth potential line configured to supply a fourth potential lower than the second potential.

13. The semiconductor device as claimed in claim 12, wherein the first subword driver includes a fifth transistor coupled between a first node and the first subword line, the first node configured to supply one of complementary drive signals, a sixth transistor coupled between the first subword line and the second node, control terminals of the fifth and sixth transistors an associated one of a plurality of main word signals, a seventh transistor coupled between the first subword line and the second node, and the seventh transistor including a control terminal receiving an other of the complementary drive signals.

14. The semiconductor device as claimed in claim 12, wherein each of the first and second potentials is a negative potential.

15. The semiconductor device as claimed in claim 12,
   wherein the third potential is a power supply potential, and
   wherein the fourth potential is a substrate potential.

* * * * *

UNITED STATES PATENT AND TRADEMARK OFFICE
CERTIFICATE OF CORRECTION

| | | |
|---|---|---|
| PATENT NO. | : 9,552,866 B2 | |
| APPLICATION NO. | : 14/642411 | |
| DATED | : January 24, 2017 | |
| INVENTOR(S) | : Noriaki Mochida | |

It is certified that error appears in the above-identified patent and that said Letters Patent is hereby corrected as shown below:

In the Claims

| | Reads | Should Read |
|---|---|---|
| Column 15, Line 2 | "sixth transistors an associated...." | --sixth transistors receiving an associated-- |

Signed and Sealed this
Twelfth Day of September, 2017

Joseph Matal
*Performing the Functions and Duties of the*
*Under Secretary of Commerce for Intellectual Property and*
*Director of the United States Patent and Trademark Office*